United States Patent
Kojima

(10) Patent No.: US 7,394,265 B2
(45) Date of Patent: Jul. 1, 2008

(54) FLAT PORTIONS OF A PROBE CARD FLATTENED TO HAVE SAME VERTICAL LEVEL WITH ONE ANOTHER BY COMPENSATING THE UNEVENNESS OF A SUBSTRATE AND EACH IDENTICAL HEIGHT NEEDLE BEING MOUNTED ON THE CORRESPONDING FLAT PORTION THROUGH AN ADHESIVE

(75) Inventor: Akio Kojima, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/502,365

(22) PCT Filed: Jan. 24, 2003

(86) PCT No.: PCT/JP03/00655

§ 371 (c)(1), (2), (4) Date: Apr. 1, 2005

(87) PCT Pub. No.: WO03/062837

PCT Pub. Date: Jul. 31, 2003

(65) Prior Publication Data

US 2005/0225336 A1    Oct. 13, 2005

(30) Foreign Application Priority Data

Jan. 25, 2002   (JP) .............................. 2002-017040

(51) Int. Cl.
*G01R 31/02* (2006.01)

(52) U.S. Cl. ...................................... 324/754; 324/757

(58) Field of Classification Search .................. None
See application file for complete search history.

(56) References Cited

U.S. PATENT DOCUMENTS

| | | | | |
|---|---|---|---|---|
| 4,520,314 A | * | 5/1985 | Asch et al. | 324/762 |
| 5,171,992 A | * | 12/1992 | Clabes et al. | 250/306 |
| 5,357,787 A | * | 10/1994 | Kado et al. | 73/105 |
| 5,449,903 A | * | 9/1995 | Arney et al. | 250/306 |
| 5,611,942 A | * | 3/1997 | Mitsui et al. | 216/67 |
| 5,824,470 A | * | 10/1998 | Baldeschwieler et al. | 435/6 |
| 6,066,265 A | * | 5/2000 | Galvin et al. | 216/2 |

(Continued)

FOREIGN PATENT DOCUMENTS

JP        01-128381        5/1989

(Continued)

*Primary Examiner*—Paresh Patel
(74) *Attorney, Agent, or Firm*—Muramatsu & Associates

(57) ABSTRACT

A probe card on which micro probe needles are arranged at high density and with high precision without need of a complicated structure or variation in needle height. A probe card 1 installed in a wafer tester includes a board 2 having a wiring pattern for transmitting a test signal to be impressed on a wafer under test, a built-up board 10 formed on the surface of the board 2, a comb-shaped silicon-made probe needle 20 arranged on the built-up board 10 and connected to the surface wiring pattern 11, and a flat portion 12 formed by plating on the surface wiring pattern 11 on the built-up board 10 and having a surface flattened by polishing. The probe needle 20 is loaded on the flat portion 12 and thus mounted on the board 2.

9 Claims, 13 Drawing Sheets

U.S. PATENT DOCUMENTS

| | | |
|---|---|---|
| 6,232,669 B1 | 5/2001 | Khoury et al. |
| 6,307,392 B1 | 10/2001 | Soejima et al. |
| 6,388,456 B1 * | 5/2002 | Kojima ........................ 324/754 |
| 6,399,900 B1 * | 6/2002 | Khoury et al. ............... 174/267 |
| 6,426,499 B1 * | 7/2002 | Koops ......................... 250/306 |
| 6,705,154 B2 * | 3/2004 | Nakayama et al. ............ 73/105 |
| 6,724,208 B2 * | 4/2004 | Matsunaga et al. ........... 324/761 |
| 6,791,176 B2 * | 9/2004 | Mathieu et al. .............. 257/690 |
| 6,864,481 B2 * | 3/2005 | Kaito et al. .................. 250/306 |
| 7,086,149 B2 * | 8/2006 | Eldridge et al. ............... 29/876 |
| 2005/0235869 A1 * | 10/2005 | Cruchon-Dupeyrat et al. .... 106/31.29 |

FOREIGN PATENT DOCUMENTS

| | | |
|---|---|---|
| JP | 05-215775 | 8/1993 |
| JP | 07-007056 | 1/1995 |
| JP | 08-083824 | 3/1996 |
| JP | 11-133062 | 5/1999 |
| JP | 2000-304770 | 11/2000 |
| JP | 2000-346878 | 12/2000 |
| JP | 2001-159642 | 6/2001 |

* cited by examiner

FLAT PORTIONS OF A PROBE CARD FLATTENED TO HAVE SAME VERTICAL LEVEL WITH ONE ANOTHER BY COMPENSATING THE UNEVENNESS OF A SUBSTRATE AND EACH IDENTICAL HEIGHT NEEDLE BEING MOUNTED ON THE CORRESPONDING FLAT PORTION THROUGH AN ADHESIVE

TECHNICAL FIELD

The present invention relates to a probe card disposed in a wafer tester (wafer prober) for performing an electric property test of a wafer which is not packaged.

Particularly, the present invention relates to a probe card and a method of manufacturing the probe card in which probe needles to contact electrodes of a wafer are formed to be fine using silicon, nickel and the like and in which a flat portion is flattened with high precision and formed on a substrate including the probe needles mounted/fixed thereon and in which micro probe needles can be arranged at high density and with high precision without requiring any complicated structure or the like or without any variation in needle height.

BACKGROUND ART

In general, a plurality of semiconductor device chips formed on a wafer (semiconductor substrate) are tested for electric properties of each device and the like in a state of a wafer before cut into individual chips and sealed into packages, a so-called semi-finished product state. This testing of the wafer in the semi-finished product state is performed using a wafer tester called a wafer prober provided with a probe card including probe needles (probes) which contact electrodes of the wafer to apply test signals.

FIG. 13 is a front view schematically showing a wafer tester including a conventional probe card. As shown in the figure, the conventional wafer tester includes a wafer base 104 on which a wafer 103 constituting a testing object is to be mounted, and a probe card 101 positioned above the wafer base 104.

The probe card 101 includes a board 102 constituted of a printed circuit board or the like which transmits a predetermined test signal to be applied to each chip on the wafer 103 and a plurality of probe needles 120 arranged/fixed on the board 102.

The wafer base 104 is driven/controlled in a three-dimensional direction (arrow directions shown in FIG. 13) in such a manner that predetermined electrodes of the mounted wafer 103 contact the predetermined probe needles 120 of the probe card 101.

In the conventional wafer tester constituted in this manner, when the wafer base 104 is driven/controlled, the probe needles 120 of the probe card 101 contact the predetermined chip electrodes on the wafer 103. Moreover, test signals are applied to the electrodes of the wafer 103 from the tester via the board 102 of the probe card 101, and each device chip on the wafer 103 is subjected to a predetermined electric property test.

Here, in the conventional wafer tester, as shown in FIG. 13, the probe needles 120 disposed in the probe card 101 are constituted of needles formed of metals such as tungsten and the like, and a so-called cantilevered probe needle structure has been adopted in which a large number of metal needles are bent/formed into L-shapes, arranged on the board 102 having a plane disc shape, and fixed by a resin 130.

As the cantilevered probe needle, the metal needle having a total length of about 30 to 50 mm is bent/formed in such a manner that a needle height (arrow h shown in FIG. 13) on a tip side is about 10 mm. Even when there is a fluctuation in the height of the needle contacting the electrode of the wafer 103, the fluctuation can be absorbed within a limit of elasticity of the needle, for example, several μms. Moreover, a plurality of (e.g., several hundreds of) cantilevered probe needles are all arranged on the substrate, and bonded by an adhesive or the like by a manual operation.

However, a problem has occurred that the conventional probe card including the cantilevered probe needles cannot cope with the testing of highly densified and miniaturized wafers in recent years. In recent years, miniaturization and densification of semiconductor devices have remarkably advanced, and even the electrode on each chip has a micro size and interval (e.g., the electrode has one side of about 60 μm to 100 μm, and a pitch is about 100 μm to 200 μm).

In the conventional probe card, the cantilevered probe needle itself has a diameter of about 250 μm, all the probe needles have been attached by the manual operation, and therefore it has been impossible to attach a large probe needles at micro intervals on the substrate. Therefore, in recent years, the highly densified and miniaturized wafers have not been tested with the cantilevered probe card.

Additionally, in the cantilevered probe needle, there has been a problem that high frequency characteristics are deteriorated because the total length of the needle is about 30 to 50 mm.

Therefore, to solve the problem of the conventional probe card, a so-called membrane type probe card has been proposed in which a plurality of electrode bumps are formed on a thin film including a predetermined pattern wiring formed thereon and having flexibility instead of the cantilevered probe needles. Such a membrane type probe card is disclosed by Japanese Patent Application Laid-Open No. 1-128381 (page 4, FIG. 12), Japanese Patent Application Laid-Open No. 5-215775 (pages 3 and 4, FIG. 2), Japanese Patent Application Laid-Open No. 7-007056 (pages 4 and 5, FIG. 1), and Japanese Patent Application Laid-Open No. 8-083824 (pages 5 and 6, FIG. 3).

According to the membrane type probe card, fine processing of the electrode bumps formed on the thin film is possible, and therefore it has been possible to cope with the testing of the miniaturized and highly densified wafers.

However, the membrane type probe card has required a large number of complicated constituting elements such as a membrane including the electrode bumps, a holding structure which holds the membrane, and pressurizing means for energizing the membrane toward a wafer side.

Therefore, the probe card and wafer tester have been complicated and enlarged, and manufacturing costs have also increased as compared with the conventional cantilevered type.

The present inventor has realized that when silicon is etched or nickel plating or the like is used, it is possible to form a fine needle having a length of about 1 mm to 2 mm, and fine probe needles can be formed at high density and high precision without requiring the above-described membrane structure. However, thereafter it has been realized that even when the fine probe needles can be formed with high precision, and when the fine probe needles are simply mounted on the substrate, the needle heights of the probe needles are not uniform by unevenness of the substrate.

In general, for example, in a printed circuit board, the unevenness in height or flatness gently continues usually in a range of about 0.1 mm to 0.3 mm on the surface of the substrate. Therefore, when the fine probe needles having lengths of about 1 mm to 2 mm are mounted on this substrate surface, fluctuations are generated in the needle heights by the unevenness of the substrate. Additionally, the fluctuations cannot be absorbed within the elasticity limit by the probe needles having micro needle tips unlike the conventional cantilevered needle.

Therefore, as a result of further intensive researches, the present inventor has created a probe card of the present invention in which the problem of the unevenness of the substrate is solved and micro probe needles can be highly densely mounted.

That is, the present invention has been proposed to solve the above-described problem of the related arts, and an object thereof is to provide a probe card and a method of manufacturing the probe card in which probe needles to contact electrodes of a wafer are formed to be fine using silicon, nickel and the like and in which a flattened flat portion is formed on a substrate including the probe needles mounted/fixed thereon and in which fluctuations in needle heights are eliminated and micro probe needles can be arranged at high density and with high precision without requiring any complicated structure or the like.

DISCLOSURE OF THE INVENTION

A probe card of the present invention is disposed in a wafer tester. The probe card includes: a substrate having a wiring pattern which transmits a test signal to be applied to a wafer constituting a testing object; a probe needle disposed on the substrate and connected to the wiring pattern to contact an electrode of the wafer; and a flat portion which is formed on the surface of the substrate and whose surface is flattened, the probe needle being mounted on the flat portion.

According to the probe card of the present invention constituted in this manner, when the probe needle to contact the electrode of the wafer is formed, for example, of nickel, silicon and the like, fine needles each having a needle length of about 1 mm to 2 mm can be formed with high precision, and a plurality of needles can be formed at micro intervals at high density. Moreover, the flattened flat portion is formed on the substrate on which the probe needle is to be mounted, and accordingly a mounting surface of the probe needle can be formed into a flat surface having a flatness of about 10 µm or less.

Accordingly, even when unevenness, difference of elevation or the like exists on the surface of the substrate, fluctuations of needle heights are eliminated, and it is possible to arrange and fix the micro probe needles on the substrate.

Therefore, according to the present invention, the probe card including the probe needle formed to be fine with high precision can be realized by a simple structure, and testing of the highly densified wafer in recent years can be securely performed. Moreover, when the probe card according to the present invention is disposed, a whole device is prevented from being enlarged or complicated without requiring a complicated structure or the like unlike a conventional membrane structure, and there can be provided a wafer tester whose costs have been lowered.

Concretely, in the probe card of the present invention, the flat portion can be constituted to be flattened by polishing its surface. Thus, according to the present invention, the flat portion of the surface of the substrate such as a printed circuit board can be flattened with high precision by the polishing. Accordingly, a plating layer or the like is stacked on the surface of the substrate, and polished, so that the flat portion according to the present invention can be easily formed with high precision, and the probe card of the present invention can be inexpensively realized without requiring any expensive material or complicated device or the like. Here, the polishing can be performed by lap polishing for use in manufacturing, for example, wafers or DVD discs.

Moreover, in the probe card of the present invention, the substrate can be constituted to include a built-up portion formed on the surface, and the flat portion is formed on the surface of the built-up portion of the substrate. Thus, according to the present invention, the flat portion according to the present invention can be formed even with respect to the substrate including the built-up portion. In general, for example, when the wiring pattern of the printed circuit board is highly densified at a pitch width of about 100 µm, a built-up board (built-up portion) is stacked/formed on the surface of the substrate. Moreover, in the present invention, the flat portion can also be formed on the substrate including the built-up portion, and the probe card can be more highly densified and refined. Therefore, in the substrate including the built-up portion, the wiring pattern on which the flat portion of the present invention is formed means the wiring pattern of the built-up portion. It is to be noted that, needless to say, the present invention can be applied to the substrate which does not include any built-up portion.

Furthermore, in the probe card of the present invention, the flat portion can be constituted to be formed along the wiring pattern on the wiring pattern. Thus, in the present invention, the flat portion of the present invention can be formed along the wiring pattern on the wiring pattern connected to the probe needles. Accordingly, for example, when the flat portion is constituted of a conductive member, the wiring pattern itself is flattened with high precision, and the probe card according to the present invention can be realized without changing any constitution of the substrate or the probe needle. Moreover, when the wiring pattern is flattened in this manner, a mounting structure of the probe needle is similar to that of a usual probe card which does not include any flat portion, the probe card of the present invention can be applied as such to the existing tester, mounting step or the like, and there can be provided a probe card superior in versatility.

Moreover, in the probe card of the present invention, the flat portion can be constituted of a plating layer formed on the substrate. Thus, in the present invention, the flat portion can be formed, for example, by nickel plating or the like. Furthermore, the surface of the plating layer is polished or processed otherwise, and can be easily flattened. Accordingly, the flat portion according to the present invention can be easily formed with high precision. Especially when the flat portion is constituted of the plating layer having conductivity, the flat portion is formed in accordance with the wiring pattern of the substrate, accordingly the wiring pattern itself can be flattened with high precision, and a mounting structure of the fine and high-precision probe needle can be realized without changing any constitution of the substrate or the probe needle.

Furthermore, according to the probe card of the present invention, the flat portion can be constituted of a mask layer formed on the substrate. Thus, in the present invention, the flat portion can be formed by the mask layer constituted, for example, of a metal mask, a mesh mask or the like. Moreover, the surface of the mask layer is polished or processed otherwise, and can be easily flattened. Accordingly, the flat portion according to the present invention can be easily formed with high precision. Especially when the flat portion is constituted of the mask layer, the flat portion can be formed broadly in a plane form on the surface of the substrate, and the mounting of the probe needle can be facilitated.

Additionally, in the probe card of the present invention, the flat portion can be constituted of a built-up layer formed on the substrate. Therefore, in the present invention, when the built-up layer (built-up portion) is disposed on the surface of the substrate, the built-up layer is polished, and accordingly the flat portion according to the present invention can be formed directly on the built-up layer. When the built-up layer is directly polished to form the flat portion, the flat portion according to the present invention can be formed broadly in a plane manner on the surface of the substrate in the same manner as in a case where the flat portion is constituted of the mask layer. When the flat portion is formed directly on the built-up layer in this manner, the flat portion according to the present invention can be formed more easily and efficiently, and the whole probe card can be thinned and lightened.

Moreover, in the probe card of the present invention, the probe needle is formed separately from the substrate, and can be constituted to be mounted on the flat portion. Especially, the probe needle can be constituted to include a base portion and a plurality of needle portions protruding from the base portion in a comb shape. The probe needle may be constituted of silicon formed into a needle shape, and a conductive pattern formed on the surface of silicon. Therefore, according to the present invention, when silicon is etched, the probe needles which are separate from the substrate can be formed to be fine with high precision. Accordingly, the fine probe needles suitable for the probe card of the present invention including the flat portion can be easily formed with high precision. Since the probe needle is formed in a comb shape (finger shape) including a large number of fine needles, a large number of probe needles can be mounted on the substrate by one operation, an operation for mounting the probe needles can be remarkably easily performed, and the probe card according to the present invention can be easily and efficiently manufactured. It is to be noted that the probe needles formed of silicon or the like separately from the substrate can be, needless to say, formed into individual needles. Even in this case, needless to say, the needles are applicable to the probe card including the flat portion of the present invention.

On the other hand, in the probe card of the present invention, the probe needle can be formed directly on the surface of the flat portion. Moreover, the probe needle can be plated/formed into a needle shape on the surface of the flat portion. Therefore, according to the present invention, the high-precision fine probe needle can be formed directly on the flat portion, for example, by nickel plating or the like. As the probe needle by the plating, the fine plated needle can be easily formed with high precision, when masking and plating are repeated a plurality of times on the flat portion. Accordingly, the fine probe needle suitable for the probe card of the present invention including the flat portion can be easily formed with high precision. When the probe needle is formed directly on the flat portion by the plating in this manner, a need for an operation for mounting the needle onto the substrate or connecting the needle to the wiring pattern can be obviated, and the probe card according to the present invention can be easily and efficiently manufactured.

Moreover, according to the present invention, there is a method of manufacturing a probe card, in which the surface for mounting a probe needle is flattened to form a flat portion on the surface of a substrate of the probe card including: the substrate having a wiring pattern for transmitting a test signal to be applied to a wafer constituting a testing object; and a probe needle disposed on the substrate and connected to the wiring pattern to contact an electrode of the wafer, the method comprising: a step of forming a mask on the substrate on which a predetermined wiring pattern is formed; a step of forming an opening at a predetermined position of the mask; a step of plating the opening; and a step of polishing and flattening the surface of the mask. The method further comprises: a step of peeling the mask after the step of polishing and flattening the surface of the mask. Therefore, according to the present invention, the flat portion according to the present invention can be easily formed on the wiring pattern of the substrate or in another desired position with high precision by masking, patterning, plating and the like. Moreover, the surface of the flat portion can be formed into a plane using the lap polishing and the like, so that the probe card according to the present invention can be easily manufactured. It is to be noted that another method or step may also be used as long as unevenness, difference of elevation or the like of the surface of the substrate is corrected and the flat portion having high flatness can be formed.

Furthermore, according to the present invention, there is provided a method of manufacturing a probe card, in which the surface for mounting a probe needle is flattened to form a flat portion on the surface of a substrate of the probe card including: the substrate having a wiring pattern for transmitting a test signal to be applied to a wafer constituting a testing object; and a probe needle disposed on the substrate and connected to the wiring pattern to contact an electrode of the wafer, the method comprising: a step of forming a built-up portion on the substrate on which a predetermined wiring pattern is formed; and a step of polishing and flattening the surface of the built-up portion. Therefore, according to the present invention, since the built-up portion (built-up layer) is formed on the surface of the substrate, and the built-up portion is polished, the flat portion obtained by forming the surface into the plane with high precision can be formed directly on the built-up layer. When the flat portion is formed directly on the built-up portion in this manner, it is possible to more easily and efficiently manufacture the probe card including the flat portion.

BEST MODE FOR CARRYING OUT THE INVENTION

Preferable embodiments of a probe card according to the present invention will be described hereinafter with reference to the drawings.

First Embodiment

First, a first embodiment of the probe card according to the present invention will be described with reference to FIGS. 1 to 9.

[Wafer Tester]

Figure 1:
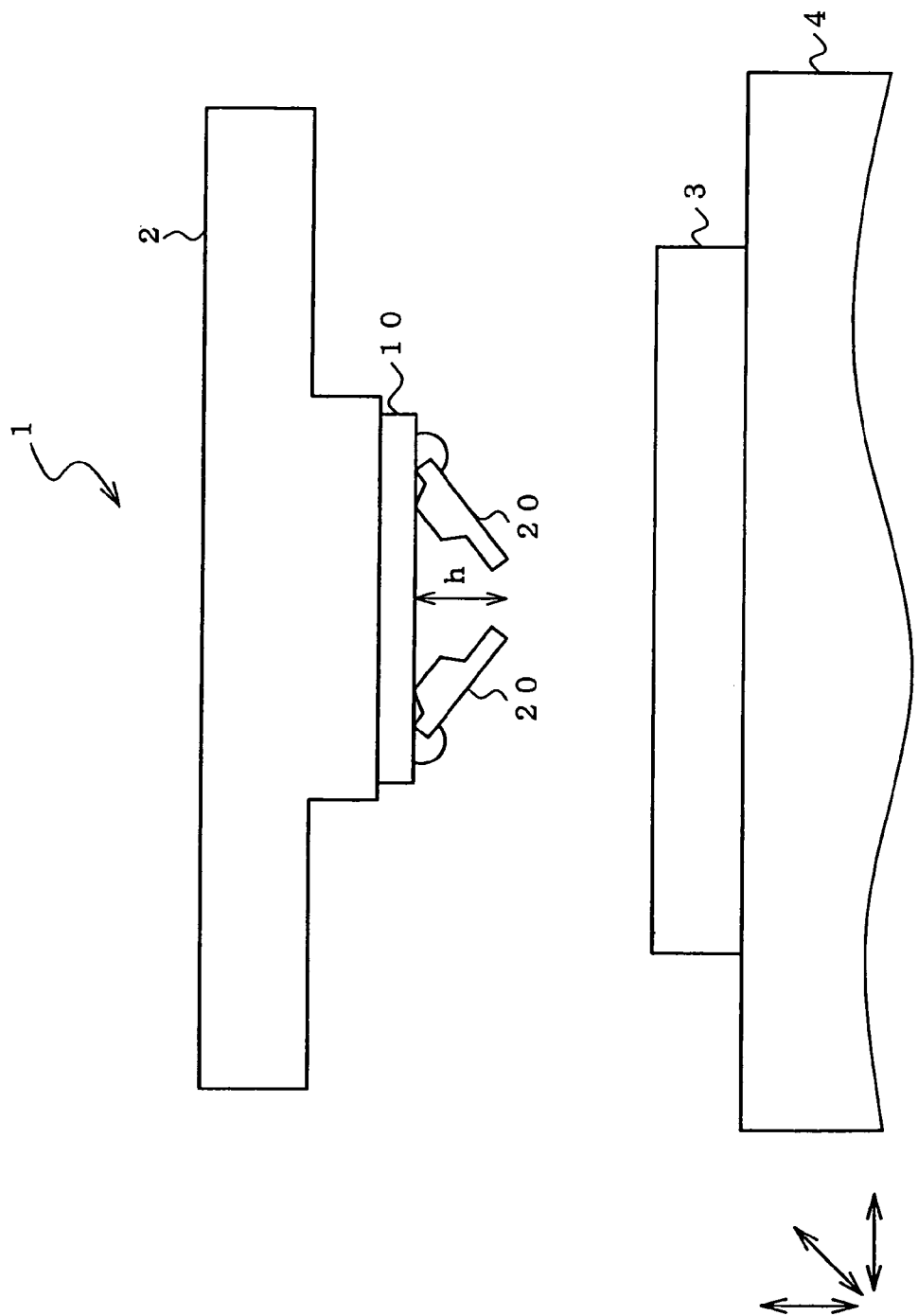
FIG. 1 is a front view schematically showing a wafer tester including a probe card according to a first embodiment of the present invention.

FIG. 1 is a front view schematically showing a wafer tester including a probe card according to a first embodiment of the present invention.

The wafer tester is a device for testing electric properties of each device in a state of a wafer before a plurality of semiconductor device chips formed on the wafer (semiconductor substrate) are cut into individual chips and sealed into a package, a so-called semi-finished product state, and is also called a wafer prober. Concretely, as shown in FIG. 1, the wafer tester includes a wafer base 4 on which a wafer 3 constituting a testing object is mounted, and a probe card 1 positioned above the wafer base 4 according to the present embodiment.

The probe card 1 includes a plurality of probe needles 20 on a board 2 constituted of a printed circuit board or the like which transmits a predetermined test signal to be applied to each chip on the wafer 3. Details of the probe card 1 will be described later.

The wafer base 4 is a mounting base of the wafer 3 which is a testing object, and is driven/controlled in a three-dimensional direction (arrow directions shown in FIG. 1) in such a manner that a predetermined electrode of the mounted wafer 3 contacts a predetermined probe needle 20 of the probe card 1. Moreover, in the wafer tester, when the wafer base 4 is driven/controlled, the probe needle 20 of the probe card 1 contacts the predetermined chip electrode of the wafer 3, and the test signal is applied to the electrode of the wafer 3 from the tester via the board 2 of the probe card 1. Accordingly, a predetermined electric property test is carried out with respect to each device chip formed on the wafer 3.

[Probe Card]

Figure 2A:
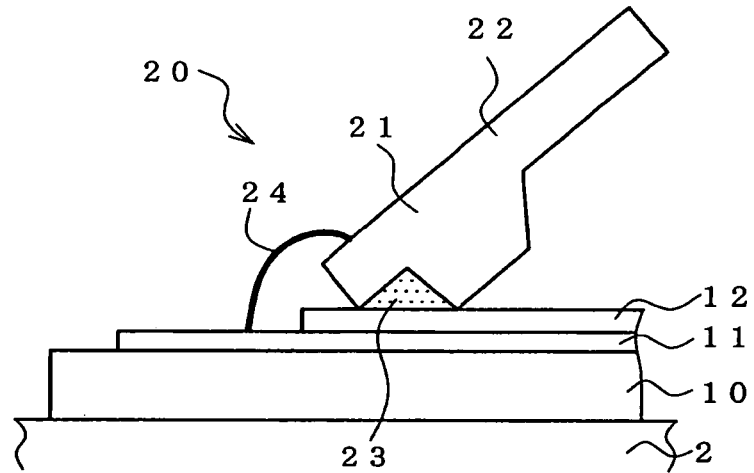
FIG. 2 schematically shows a state in which the probe card according to the first embodiment of the present invention is vertically reversed, (a) is a main part enlarged front view, and (b) is a perspective view.

FIG. 2 schematically shows a probe card according to the present embodiment, (a) is a main part enlarged front view in a state in which the card is vertically reversed, and (b) is a perspective view in a similar state. As shown in the figures, a probe card 1 includes a board 2 and a built-up board 10 constituting a base and a probe needle 20.

The board 2 is constituted of a printed circuit board or the like, and is formed into a disc shape constituting a main body of the probe card 1, and a wiring pattern (see a wiring pattern 2a shown in FIG. 3) which transmits a test signal to be applied to the wafer 3 constituting a testing object is formed on the surface. The test signal is applied to the wiring pattern from a signal generating unit or the like of the tester (not shown). Moreover, in the present embodiment, the built-up board (built-up portion) 10 is formed on the surface of the board 2. It is to be noted that the board 2 of the present embodiment has a stepped shape whose middle portion protrudes in a convex shape (see FIG. 1), and is formed in accordance with a structure on the side of the tester (not shown) to which the probe card 1 is to be attached, and the stepped shape is not especially indispensable. Therefore, needless to say, the substrate may also be formed into a usual flat plate shape.

Figure 3:
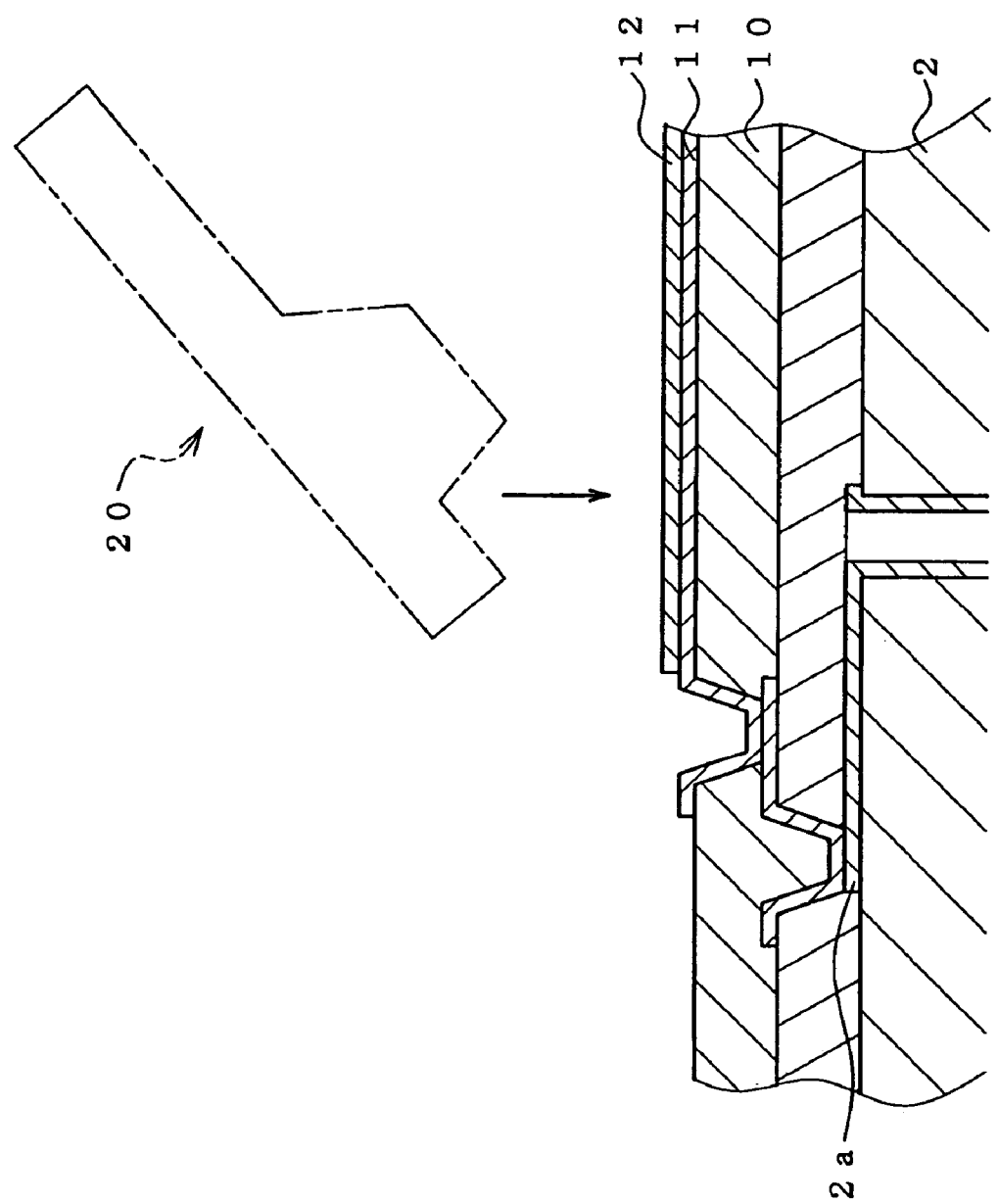
FIG. 3 is a sectional view schematically showing a substrate and a built-up board constituting a base of the probe card according to the first embodiment of the present invention.

FIG. 3 is a sectional view schematically showing the board 2 and the built-up board 10 of the probe card 1 according to the present embodiment. As shown in the figure, the built-up board 10 is a multilayered substrate (two layers in FIG. 3) in which the optional number of insulating layers and conductive layers are alternately stacked/formed on the surface of the board 2 constituting the base.

In general, the built-up board is a multilayered substrate stacked/formed on the surface of the substrate, for example, in a case where the wiring pattern of the printed circuit board is highly densified at a pitch width of 100 μm. In the present embodiment, the built-up board 10 is disposed on the board 2 of the probe card 1, and accordingly the probe card 1 is highly densified.

Moreover, a flat portion 12 whose surface is flattened is formed on the wiring pattern (see a surface wiring pattern 11 shown in FIG. 3) of the surface of the built-up board 10.

Figure 4A:
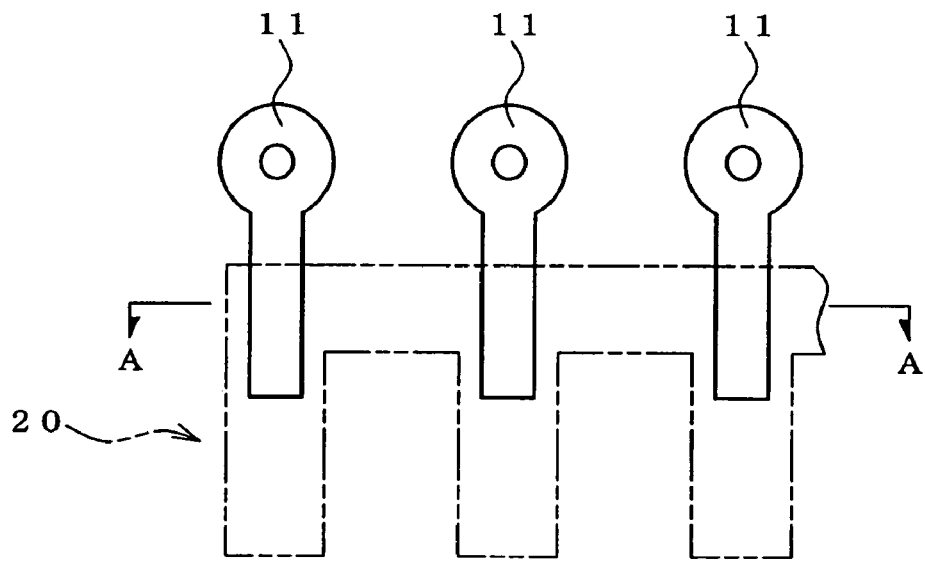
FIG. 4 schematically shows a built-up board on which a flat portion of the probe card is to be formed according to the first embodiment of the present invention, (a) is a schematic plan view, (b) is a sectional view along line A-A of (a) before the flat portion is formed, and (c) is a sectional view along line A-A of (a) in which the flat portion is formed.
Figure 4B:
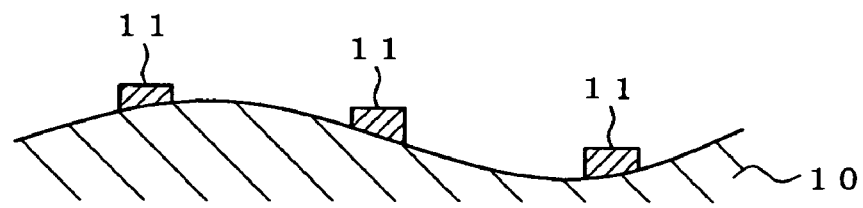
Figure 4C:
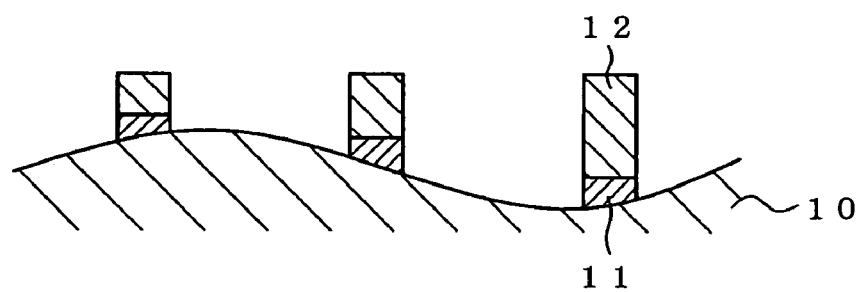

FIG. 4 shows a plan view (FIG. 4(a)) and a sectional view (FIG. 4(b)) of the built-up board 10 on which the flat portion 12 is formed. As shown in the figure (b), the surface of the built-up board 10 (and the board 2) has a shape in which gentle unevenness continues, and a difference of elevation usually exists in a range of about 0.1 mm to 0.3 mm. Therefore, when the fine probe needle 20 is mounted as such on the surface of the built-up board 10, fluctuations are generated in needle height by the unevenness of the built-up board 10. Additionally, it is difficult to absorb the fluctuation within an elasticity limit by the micro probe needle 20. To solve the problem, in the present embodiment, as shown in FIG. 4(c), the flat portion 12 flattened with high precision is formed on the surface of the built-up board 10.

Concretely, the flat portion 12 according to the present embodiment is constituted of a nickel plating layer plated/formed on the surface of the built-up board 10. Moreover, the surface of the nickel plating layer is polished and flattened to form the flat portion 12. When the flat portion 12 is formed by nickel plating or the like, and the surface of the plating layer is polished or processed otherwise, the high-precision flattened flat portion 12 having a flatness of about 10 μm or less can be formed (see FIGS. 6 and 7 described later). As a result, the surfaces of the flat portions 12 become the same vertical level with one another as shown in FIG. 4(c).

Figure 8A:
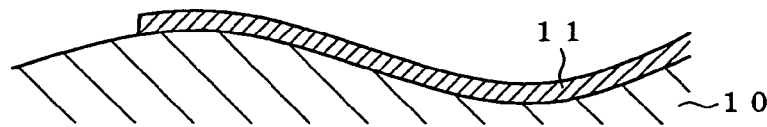
FIG. 8 is an explanatory view showing a modification of the manufacturing step for the flat portion of the probe card according to the first embodiment of the present invention.
Figure 8B:
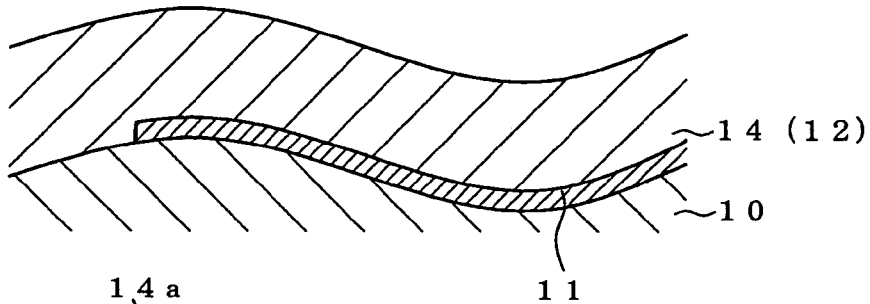
Figure 8C:
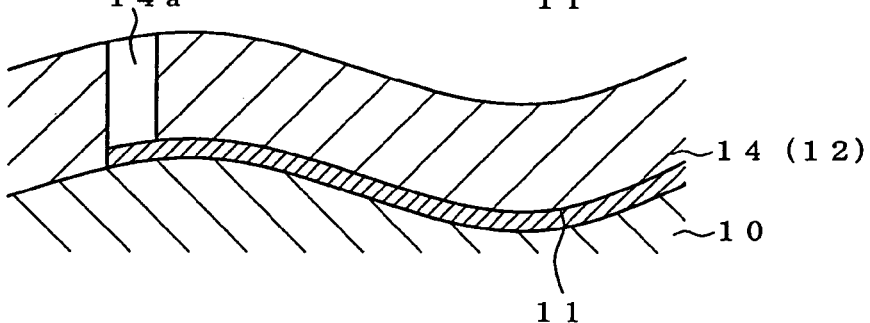
Figure 8D:
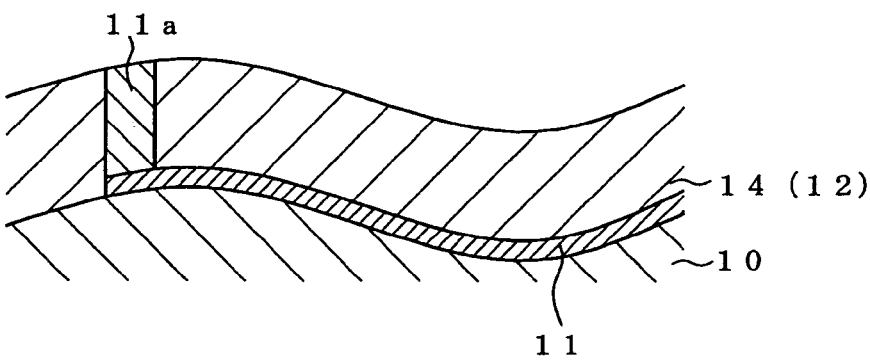
Figure 8E:
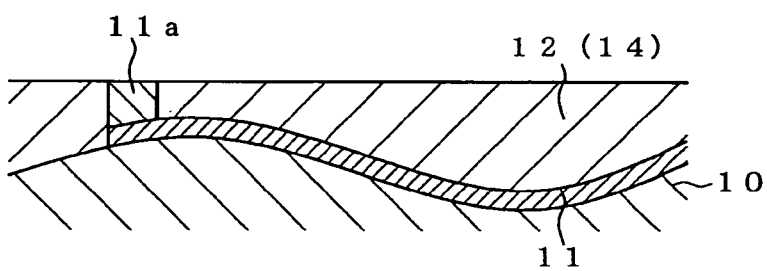
Figure 9:
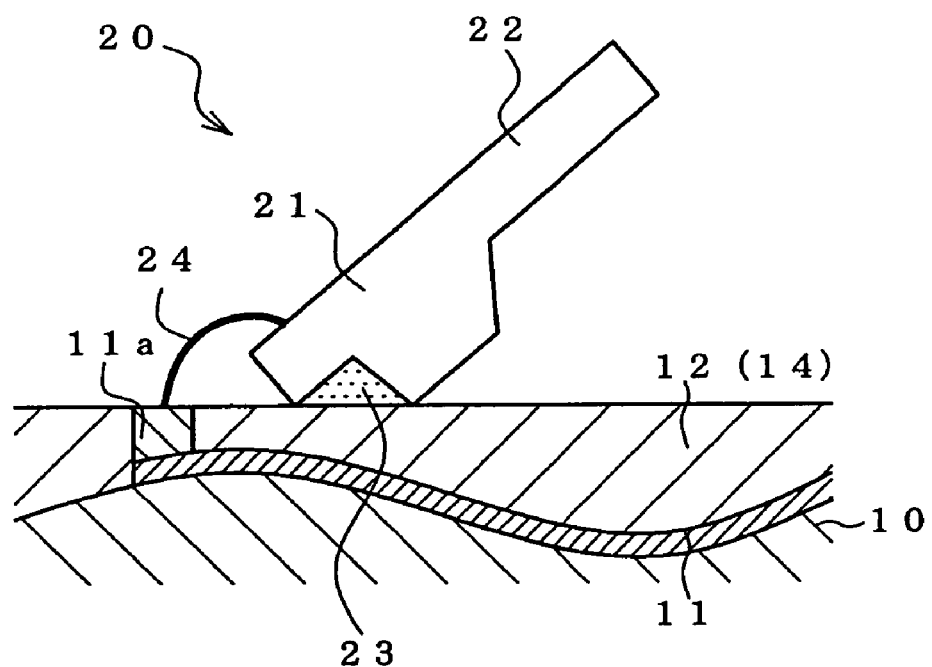
FIG. 9 is an explanatory view showing a modification of the manufacturing step for the flat portion of the probe card according to the first embodiment of the present invention.
Figure 10A:
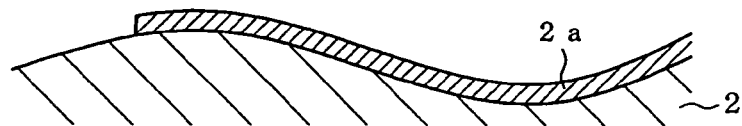
FIG. 10 is an explanatory view showing another modification of the manufacturing step for the flat portion of the probe card according to the first embodiment of the present invention.
Figure 10B:
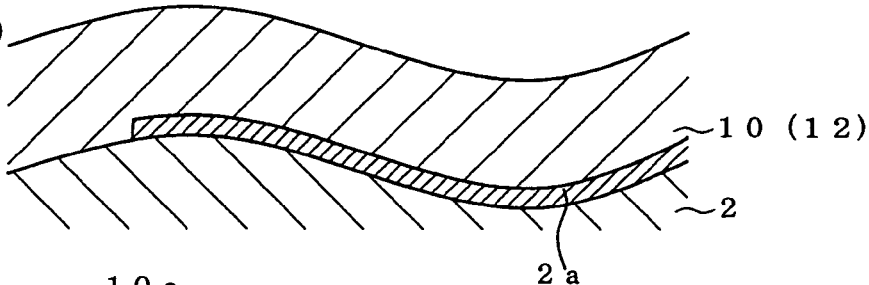
Figure 10C:
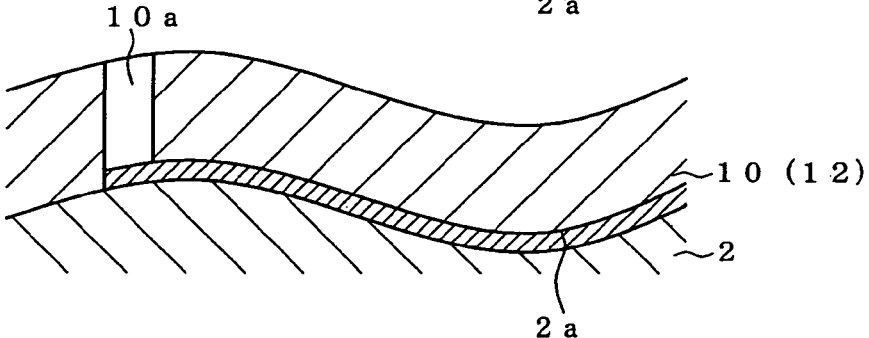
Figure 10D:
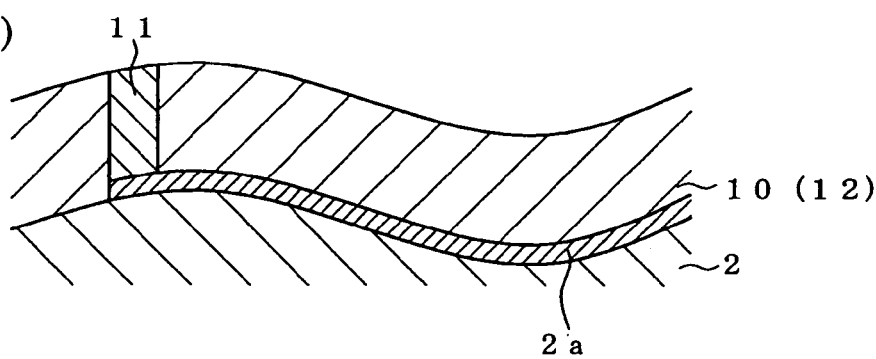
Figure 10E:
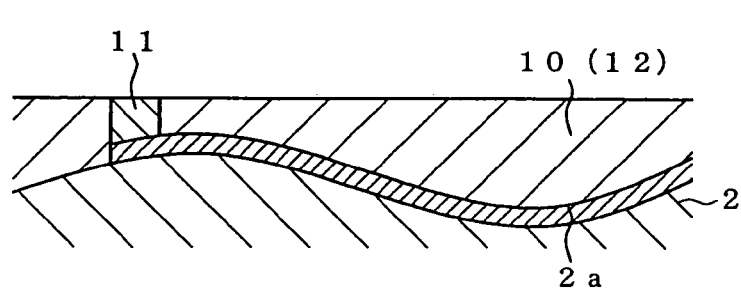

It is to be noted that the flat portion 12 may also be constituted of a mask layer formed on the substrate surface instead of the plating layer (see FIGS. 8 and 9). Instead of forming the plating layer or the mask layer, the flat portion 12 may also be formed by directly polishing the built-up board 10 on the board 2 (see FIG. 10).

Here, as a polishing method for flattening the flat portion 12, for example, lap polishing may be used. The lap polishing is a type of precise finishing, and is a polishing method for use in a case where a degree of precision higher than that by grinding is required, and the method is used, for example, in manufacturing wafers or DVD discs, or precisely finishing optical glass products such as lenses and prisms.

Concretely, in the lap polishing, a lapping agent constituted of a processing solution (lapping solution) and abrasive grains is inserted between a tool called a lap and an object to be polished, the tool and the object are slid/moved, and accordingly a satisfactory smooth surface is formed using an abrasive function between them.

As the lapping agent for use in the lap polishing, in general, the abrasive grains such as alumina powder, silicon carbide powder, and diamond powder are blended with the lapping solution such as light oil, spindle oil, and machine oil for use. The lap polishing can be performed using a lapping machine for exclusive use, and may also be performed by a manual operation.

By the use of this lap polishing, the flat portion 12 constituted of the plating layer of the present embodiment can be flattened with the high-precision flatness.

Figure 2B:
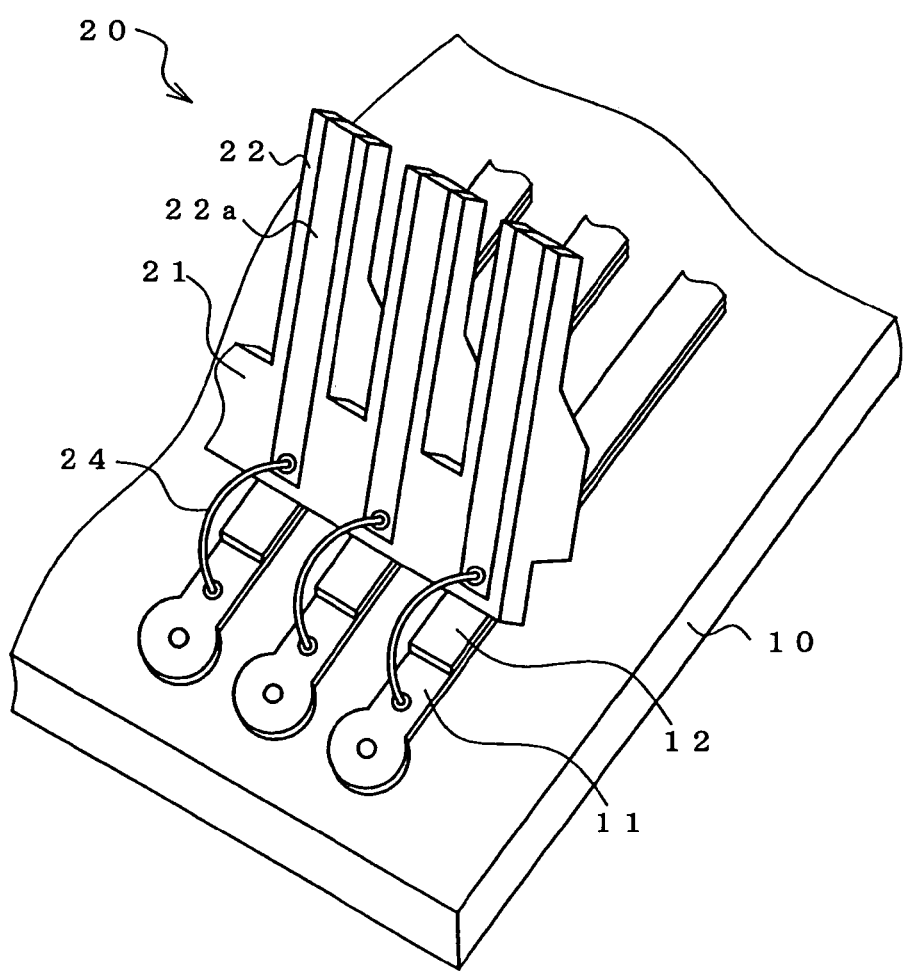

Moreover, in the present embodiment, the flat portion 12 is formed on the surface wiring pattern 11 of the built-up board 10 in such a manner as to extend along the surface wiring pattern 11 (see FIG. 2(b)). When the flat portion 12 is stacked/formed along the wiring pattern 11 in this manner, a result similar to that in a case where the wiring pattern itself is flattened by the flat portion 12 constituted of a conductive member of nickel or the like is obtained. The probe card 1 according to the present embodiment can be realized without changing any constitution of the built-up board 10, board 2, or probe needle 20. Therefore, a mounting structure of the probe needle 20 can be constituted in the same manner as in the usual probe card 1 which does not include any flat portion 12, and the probe card 1 of the present embodiment can be applied as such to the existing tester, mounting step and the like. It is to be noted that the flat portion 12 is not restricted by a case where the section is formed along the wiring pattern 11 as shown in FIG. 2(b). For example, when the flat portion 12 is constituted of a mask layer as described later, or when the flat portion 12 is formed directly on the built-up board 10, the flat portion 12 can be formed in a plane form over the whole surface of the built-up board 10 (or the board 2) (see FIGS. 8 to 10).

Moreover, the probe needle 20 is mounted on the flat portion 12.

The probe needle 20 is a probe connected to the wiring pattern of the board 2 via the built-up board 10 to contact the electrode of the wafer 3 which is a testing object. As shown in FIG. 2, the probe needle 20 of the present embodiment is formed separately from the board 2 (and the built-up board 10), mounted on the flat portion 12, and bonded by an adhesive 23 or the like. Concretely, the probe needle 20 is formed into a comb shape including a base portion 21, and a plurality of needle portions 22 protruding from the base portion 21.

The base portion 21 connects the plurality of needle portions 22 to one another, and the bottom surface of the base portion is formed in such a shape that the probe needle 20 rises at a predetermined angle from the surface of the built-up board 10. A space filled with the adhesive 23 for bonding is formed on the side of the bottom surface of the base portion.

The plurality of needle portions 22 are formed to protrude in a comb shape (finger shape) from the base portion 21, and concretely several hundreds of needle portions 22 each having a total length of about 1 mm to 2 mm are formed. Moreover, the needle portions 22 protrude from the surface of the built-up board 10, and accordingly the probe needle 20 having a needle height (arrow h shown in FIG. 1) of 1 mm or less is obtained.

When the probe needle 20 is formed into the comb shape including a large number of fine needle portions 22 in this manner, a large number of probe needles (needle portions 22) can be mounted on the board 2 (built-up board 10) by one operation. It is to be noted that, needless to say, the number or needle lengths of needle portions 22 may be appropriately changed in accordance with the number of electrodes of the wafer 3 constituting the testing object, the wiring pattern of the board 2 or the built-up board 10 on which the portions are to be mounted and the like.

In the present embodiment, silicon is etched to form the probe needle 20. Concretely, the opposite surfaces of the silicon wafer are formed into predetermined shapes (needle shapes constituting the comb shape in the present embodiment) by the etching in the same manner as in the use in a method of manufacturing semiconductors. Moreover, a silicon oxide film is formed as an insulating layer on the surface of a comb-shaped silicon main body. Accordingly, each needle portion 22 is insulated. Furthermore, conductive patterns 22a constituted of conductive metals or the like are formed on the surfaces of the respective needle portions 22 insulated by the silicon oxide film. When silicon is etched in this manner, the comb-shaped probe needle 20 can be finely formed with high precision separately from the substrate, and the fine probe needle to be suitably mounted on the flat portion 12 flattened with high precision as described above can be easily formed with high precision.

Moreover, the probe needle 20 is mounted on the flattened flat portion 12, bonded to the surface of the built-up board 10 by the adhesive 23, and connected to the surface wiring pattern 11 of the built-up board 10. As shown in FIG. 2, the probe needle 20 is connected to the surface wiring pattern 11 of the built-up board 10 by bonding wires 24. The bonding wires 24 are wires fixed onto the conductive patterns 22a of the surfaces of the respective needle portions 22 and the surface wiring pattern 11 of the built-up board 10 by soldering or the like, and electrically connect the conductive patterns 22a of the needle portions 22 to the surface wiring pattern 11 of the built-up board 10. Accordingly, the respective needle portions 22 of the probe needle 20 are connected to the conductive patterns 2a of the board 2 via the built-up board 10, and test signals are applied to the electrodes of the wafer 3 from the tester.

Figure 5A:
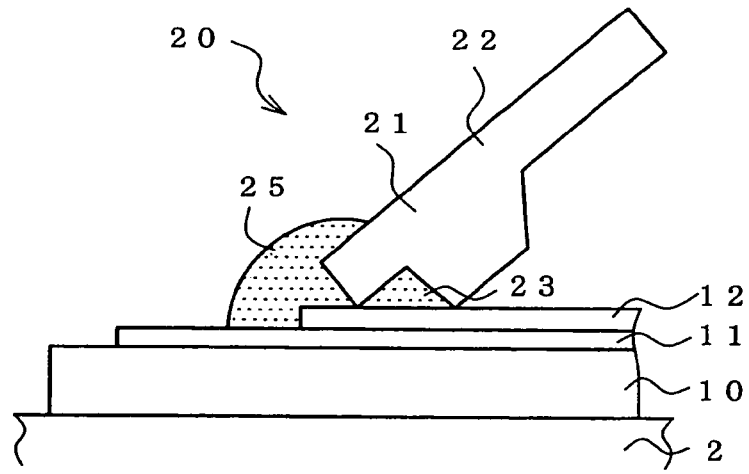
FIG. 5 schematically shows a state in which the probe card according to a modification of the first embodiment of the present invention is vertically reversed, (a) is a main part enlarged front view, and (b) is a perspective view.
Figure 5B:
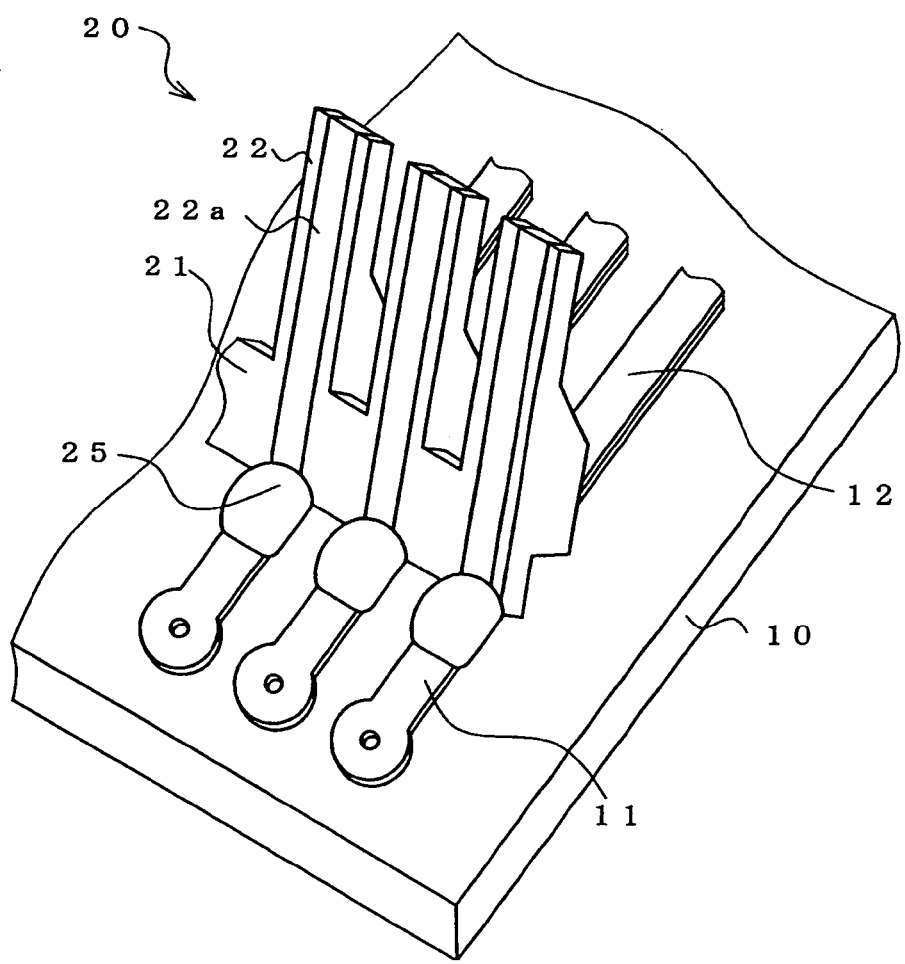

It is to be noted that in the connection of the probe needle 20 to the surface wiring pattern 11 of the built-up board 10, not only the bonding wires 24 shown in FIG. 2 but also other means such as the soldering and the like may be used. FIG. 5 shows a modification of a connected configuration of the probe needle 20 to the surface wiring pattern 11. As shown in the figure, the probe needle 20 may also be connected to the surface wiring pattern 11 of the built-up board 10 by soldering (soldering portions 25 of FIG. 5). Even in this case, the probe needle 20 can be electrically connected to the surface wiring pattern 11. Moreover, in the connection by the soldering portions 25, the bonding wires 24 can be omitted, and a connecting operation can be easily and efficiently performed. Any configuration may also be adopted in the connection of the probe needle 20 to the surface wiring pattern 11 in this manner, as long as the test signal to be applied to the wafer 3 is transmitted without any trouble.

[Method of Manufacturing Probe Card]

Next, a method of manufacturing a probe card will be described with reference to FIGS. 6 and 7, in which a flat portion 12 is formed on the surface of the built-up board 10 according to the present embodiment constituted as described above. FIGS. 6(a) to (d) and FIGS. 7(a) to (c) are explanatory views showing one manufacturing step for the flat portion of the probe card according to the present embodiment.

Figure 6A:
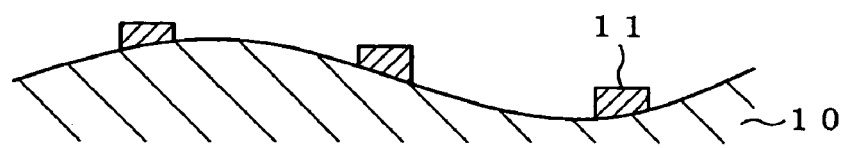
FIG. 6 is an explanatory view showing one manufacturing step for the flat portion of the probe card according to the first embodiment of the present invention.
Figure 6B:
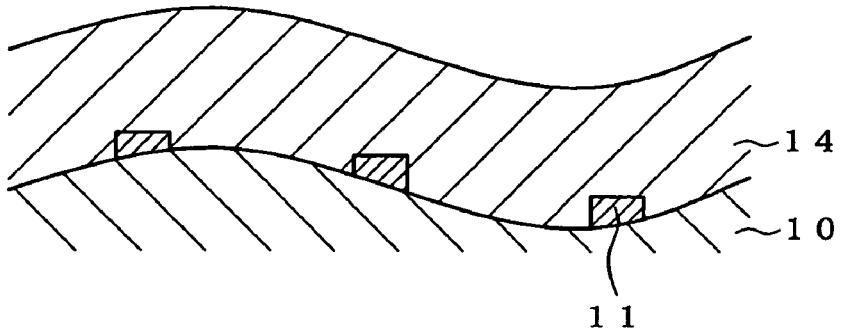

First, a built-up board 10 on which a predetermined wiring pattern 11 is formed is prepared (see FIG. 6(a)), and a mask 14 is formed on the surface of the built-up board 10 (see FIG. 6(b)). Here, as the mask 14, a metal mask using metal foils such as copper, stainless, and nickel, a meshed mask by a resin fiber or a metal wire woven into a mesh and the like are usable.

Figure 6C:
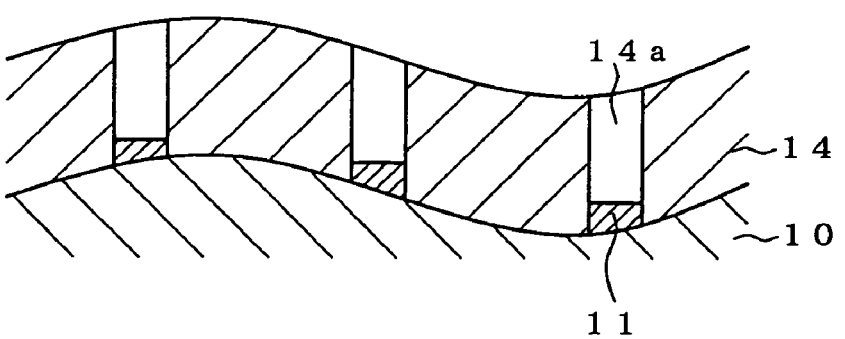

Next, the mask 14 is patterned to form openings 14a (see FIG. 6(c)). In the present embodiment, the openings 14a are formed in positions facing the surface wiring pattern 11 of the built-up board 10 along the surface wiring pattern 11. Here, the mask 14 can be etched to pattern the openings 14a into desired positions, shapes and the like.

Figure 6D:
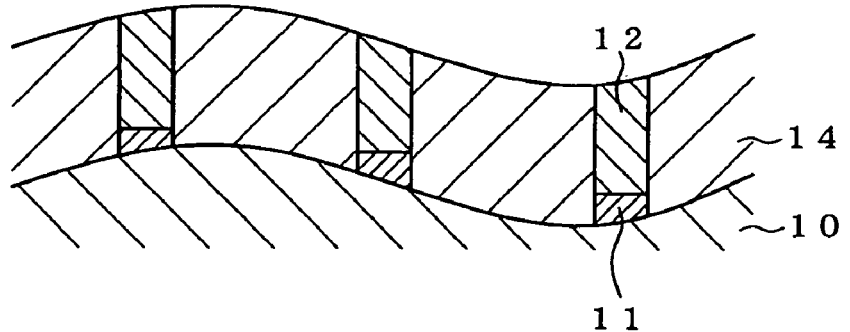

Thereafter, the openings 14a are plated with nickel (see FIG. 6(d)).

Accordingly, the flat portion 12 which is not flattened is formed.

Figure 7A:
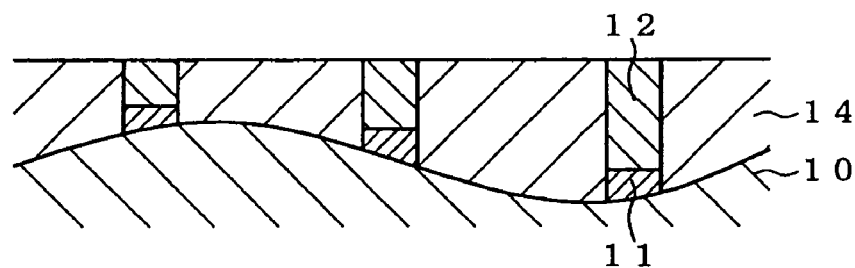
FIG. 7 is an explanatory view showing one manufacturing step for the flat portion of the probe card according to the first embodiment of the present invention.

Moreover, the surface of the mask 14 plated with nickel is polished and flattened (see FIG. 7(a)). Here, as the polishing method, as described above, the lap polishing is preferably used. After the polishing ends, the mask 14 is peeled (see FIG. 7 (b)). Accordingly, the flattened flat portion 12 is formed on the surface wiring pattern 11 of the built-up board 10. Consequently, the surfaces of the flat portions 12 become the same vertical level with one another as shown in FIGS. 7(a) and 7(b).

Moreover, a probe needle 20 can be mounted on the flat portion 12 (see FIG. 7 (c)). The probe needle 20 mounted on the flat portion 12 is bonded by an adhesive 23, and is electrically connected to the surface wiring pattern 11 of the built-up board 10 by bonding wires 24.

Accordingly, the manufacturing of the probe card 1 of the present embodiment completes, in which the probe needle 20 protrudes by a needle height (arrow h shown in FIG. 1) of 1 mm or less from the surface of the built-up board 10. In this manner, according to the method of manufacturing the probe card of the present embodiment, the flat portion 12 can be easily formed with high precision on the surface wiring pattern 11 of the built-up board 10 or in another desired position by the masking, patterning, plating and the like. Moreover, the surface of the flat portion 12 can be flattened with high precision using the lap polishing or the like.

Figure 7B:
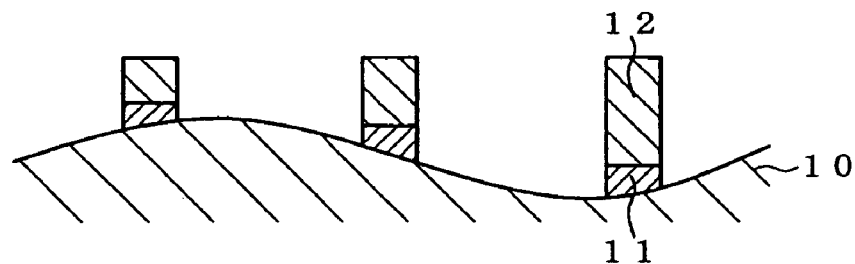
Figure 7C:
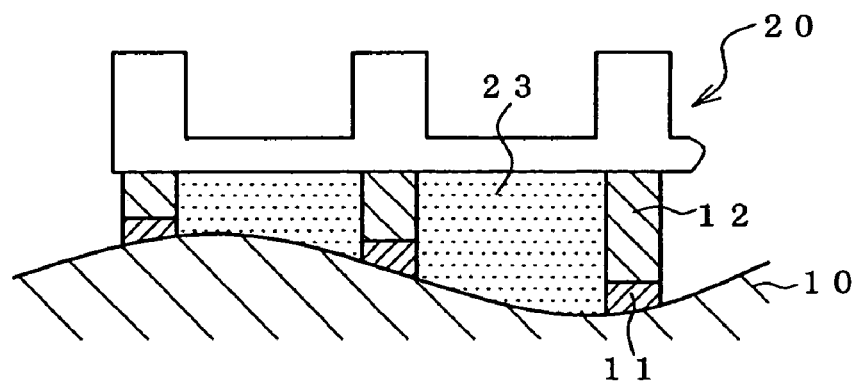

In the above-described manufacturing method, the mask 14 is used only in forming the flat portions 12, and is peeled after the flattening by the polishing is performed (see FIG. 7(b)), but a step of peeling the mask 14 may also be omitted, and the mask 14 is left on the surface of the built-up board 10 (or the board 2) to form the flat portion 12, and may also be used as a base of the probe needle 20. FIGS. 8(a) to (e) and 9 are explanatory views showing manufacturing steps in a case where the mask 14 is used as the flat portion 12.

As shown in these figures, when the mask 14 is used as the flat portion 12, in the same manner as shown in FIGS. 6, 7, first a built-up board 10 on which a predetermined wiring pattern 11 has been formed is prepared (see FIG. 8(a)), and the mask 14 is formed on the surface of the built-up board 10 (see FIG. 8(b)).

As the mask 14, as described above, a metal mask using metal foils such as copper, stainless, and nickel, a mesh mask by a resin fiber or a metal wire woven into a mesh and the like are usable.

Next, the mask 14 is patterned by etching to form an opening 14a (see FIG. 8(c)). As shown in FIG. 8, unlike FIG. 6 described above, the openings 14a do not have to be formed along the surface wiring pattern 11 of the built-up board 10, and the opening may be formed in at least a part of the surface wiring pattern 11 in such a manner as to be conductible. When the opening 14a is plated with nickel, a conductive layer 11a is formed in such a manner that the surface wiring pattern 11 electrically conducts to the surface of the mask 14 (see FIG. 8(d)).

The surface of the mask 14 on which the conductive layer 11a is formed in this manner is polished and flattened (see FIG. 8(e)). It is to be noted that as a polishing method, the lap polishing is preferably used in the same manner as in FIG. 7 described above.

Accordingly, the flat portion 12 obtained by flattening the mask 14 (and the conductive layer 11a) is formed on the surface of the built-up board 10. Moreover, the probe needle 20 can be mounted on the flat portion 12 constituted of the mask 14 in this manner (see FIG. 9). The probe needle 20 mounted on the flat portion 12 is bonded by the adhesive 23, and is connected to the conductive layer 11a which conducts to the surface wiring pattern 11 of the built-up board 10 by the bonding wires 24.

Accordingly, the manufacturing of the probe card 1 of the present embodiment using the mask 14 as the flat portion 12 completes. When the flat portion 12 is constituted of the mask 14 in this manner, as shown in FIG. 9, the flat portion 12 is formed into a plane shape over the whole surface of the built-up board 10 (or the board 2).

Even when the flat portion 12 is constituted by the flattening without peeling the mask 14, the flat portion 12 flattened with high precision can be easily formed, and the high-precision probe card can be easily obtained in the same manner as in the manufacturing method shown in FIGS. 6, 7. It is to be noted that the flat portion 12 constituted of the mask 14 is not restricted by a case where the section is formed on the surface of the built-up board 10, and the section may also be formed directly on the surface of the board 2 which does not include the built-up board 10 in the same manner as in the flat portion 12 constituted of the above-described plating layer.

Furthermore, instead of forming the flat portion 12 by the above-described plating layer or mask layer, the flat portion may also be formed by directly polishing the built-up board 10 of the board 2.

FIGS. 10(a) to (e) are explanatory views showing manufacturing steps in a case where the flat portion 12 is formed directly on the built-up board 10. As shown in the figures, when the flat portion 12 is directly formed on the built-up board 10, first the built-up board 10 constituted by alternately stacking insulating layers and conductive layers as shown in FIG. 3 is formed on the surface of the board 2 including a predetermined wiring pattern 2a (see FIG. 10(a)) (see FIGS. 10(b) and (c)).

The wiring pattern 11 is formed on the insulating layer of the built-up board 10 via a through-hole 10a, and is connected to the wiring pattern 2a of the board 2. Moreover, the surface of the built-up board 10 stacked/formed on the surface of the board 2 in this manner (one layer in FIG. 10) is polished and flattened (see FIG. 10(e)). As a polishing method, the lap polishing is preferably used in the same manner as in the polishing of the above-described plating layer or mask layer.

Accordingly, the surface of the built-up board 10 is formed as the flat portion 12 flattened with high precision. Therefore, when the probe needle 20 is mounted on the flat portion 12, and is electrically connected to the wiring pattern 11 via bonding wires or the like, the probe needle 20 can be mounted directly on the flat portion 12 constituted of the built-up board 10.

The flat portion 12 may also be formed directly on the built-up board 10 in this manner. In this case, the flat portion 12 can be formed broadly in a plane manner on the surface of the board 2 (built-up board 10) in the same manner as in a case where the flat portion 12 is constituted of the above-described mask layer. Moreover, when the flat portion 12 is formed directly on the built-up board 10 in this manner, the flat portion 12 can be manufactured easily and efficiently, and further the whole probe card can also be thinned and lightened.

As described above, by the probe card and the method of manufacturing the probe card according to the present embodiment, when the probe needle 20 contacting the electrode of the wafer 3 constituting the testing object is formed, for example, by silicon, the fine needle having a needle length of about 1 mm to 2 mm can be formed with high precision, and a plurality of needles can be formed at micro intervals. Moreover, the flat portion 12 flattened by the lap polishing or the like is formed on the built-up board 10 of the board 2 on which the probe needle 20 is to be mounted, and accordingly the surface for mounting the probe needle 20 can be formed into a high-precision flat surface having a flatness of about 10 μm or less.

Accordingly, the fluctuations of the needle heights can be eliminated even with the presence of the unevenness on the surface of the board 2, and the micro probe needle 20 having a needle height of 1 mm or less can be disposed and fixed onto the board 2. Therefore, according to the present embodiment, the probe card 1 including the probe needle 20 finely formed with high precision can be realized without requiring any complicated structure like a conventional membrane structure, and there can be provided a wafer tester whose cost is low without enlarging or complicating the whole device.

Second Embodiment

Next, a second embodiment of a probe card according to the present invention will be described with reference to FIGS. 11 and 12.

Figure 11A:
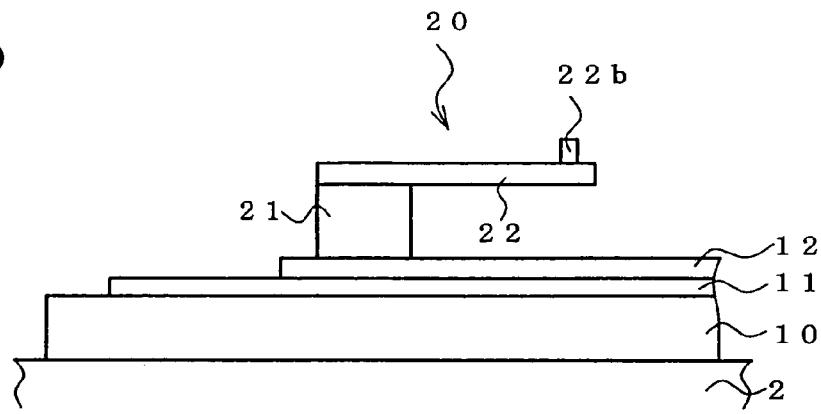
FIG. 11 schematically shows a state in which the probe card according to a second embodiment of the present invention is vertically reversed, (a) is a main part enlarged front view, and (b) is a perspective view.
Figure 11B:
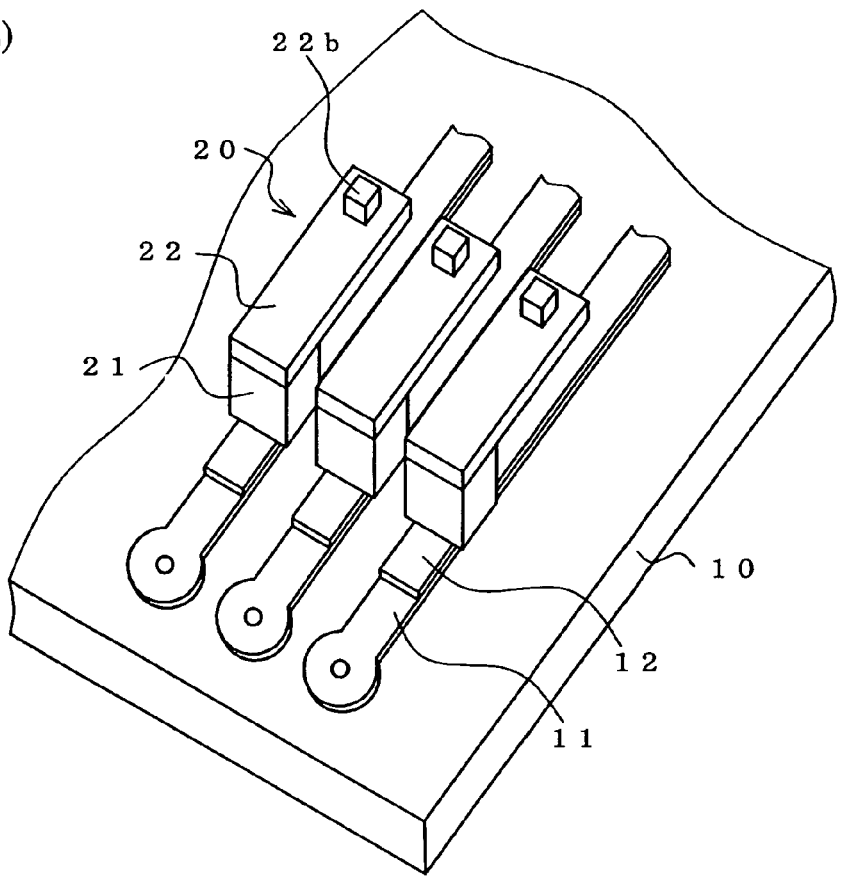

FIG. 11 schematically shows a state in which the probe card according to the second embodiment of the present invention is vertically reversed, (a) is a main part enlarged front view, and (b) is a perspective view.

Figure 12A:
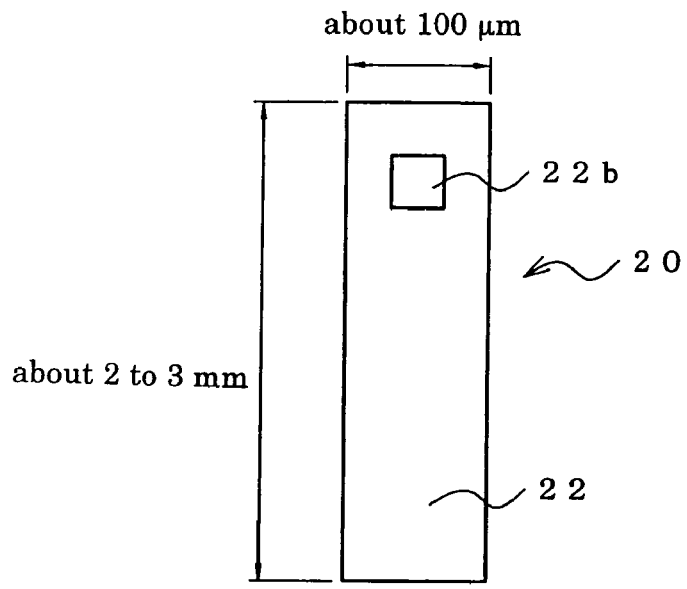
FIG. 12 schematically shows a probe needle formed on the probe card according to the second embodiment of the present invention, (a) is a plan view, (b) is a front view, and (c) is a left side view.
Figure 12B:
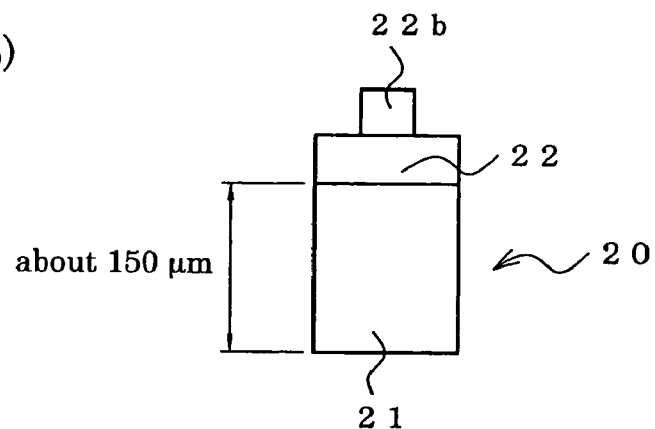
Figure 12C:
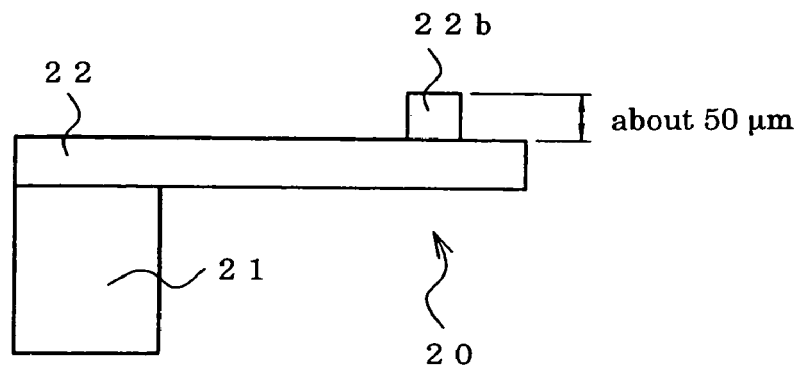
Figure 13:
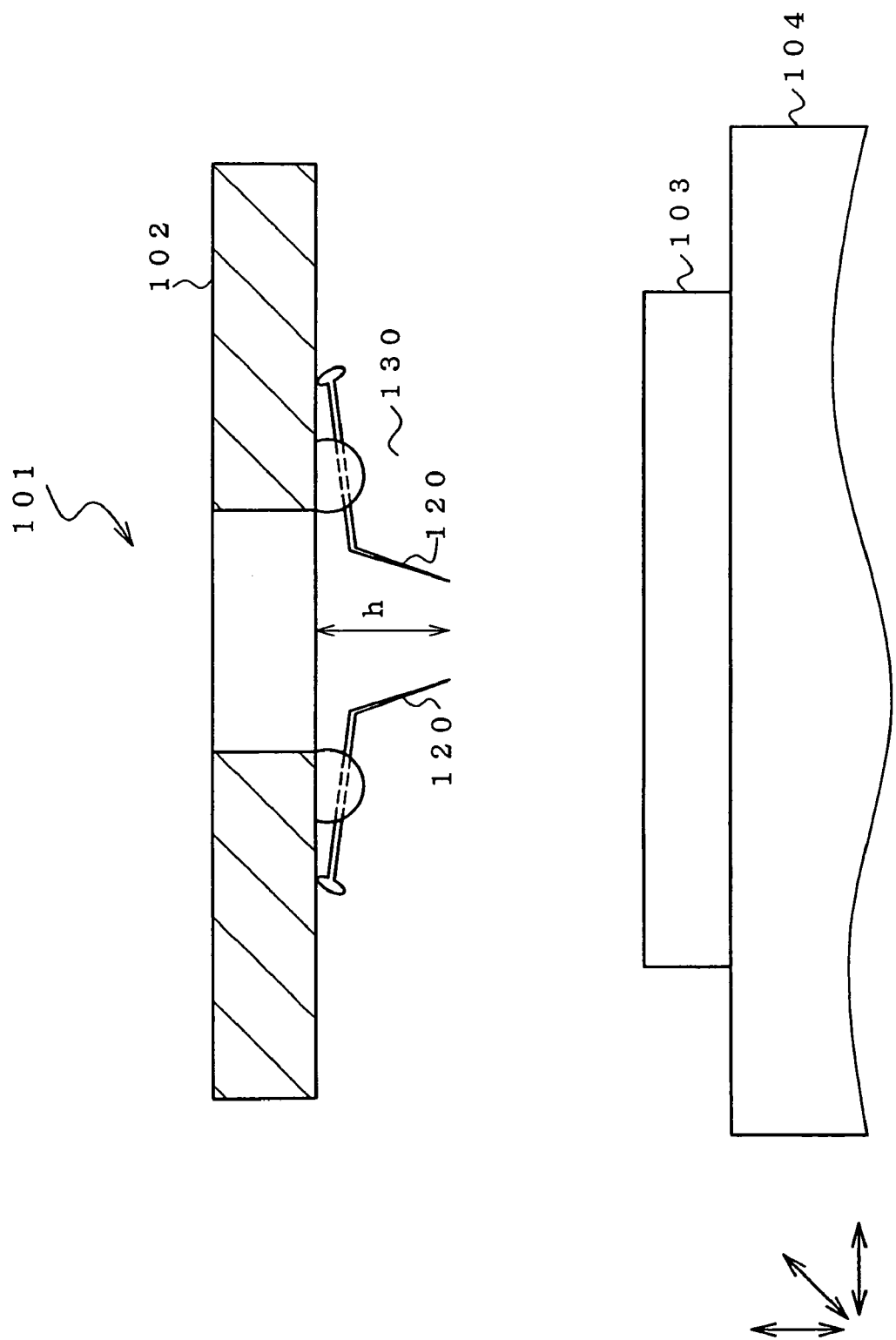
FIG. 13 is a front view schematically showing a wafer tester including a conventional probe card.

FIG. 12 schematically shows a probe needle formed on the probe card according to the present embodiment, (a) is a plan view, (b) is a front view, and (c) is a left side view.

As shown in these figures, the probe card according to the present embodiment is a modified embodiment of the above-described first embodiment, and as the probe needle mounted on the flat portion, a nickel-plated probe needle is used instead of the silicon-formed probe needle formed into the comb shape in the first embodiment. Therefore, other constituting portions are similar to those of the first embodiment, and the similar constituting portions are denoted with the same reference numerals as those of the first embodiment in the figure, and detailed description is omitted.

As shown in FIG. 11, the probe card 1 of the present embodiment is constituted in such a manner that the probe needle 20 is formed directly on the surface of the flat portion 12.

In the present embodiment, the probe needle 20 is formed by the surface of the flat portion 12 plated into a needle shape with nickel. Concretely, when masking and plating are repeated on the flat portion 12 a plurality of times, the probe needle 20 can be formed as shown in FIG. 11.

First, a base portion 21 is formed for each surface wiring pattern 11 on the flat portion 12, and thereafter needle portions 22 protruding in parallel with the surface of the board 2 (built-up board 10) are formed on each base portion 21. Furthermore, a protrusion 22b which is a contact portion is formed on the tip of the needle portion 22. Accordingly, mutually independent probe needles 20 can be formed directly on the flat portion 12.

In this manner, in the probe needle 20 formed by the nickel plating, for example, as shown in FIG. 12, the needle portion 22 has a total length of about 2 mm to 3 mm, and a total width of about 100 μm (see FIG. 12(a)), the base portion 21 has a height of about 150 μm (see FIG. 12(b)), and the protrusion 22b on the needle portion tip has a height of about 50 μm. This fine probe needles 20 can be formed and mounted on the flat portion 12 at a pitch of about 100 μm or the like. Accordingly, in the same manner as in the first embodiment, the fine probe needle 20 suitable for the probe card 1 including the flat portion 12 can be formed easily with high precision. In the present embodiment in which the probe needle 20 is formed directly on the flat portion 12 by the plating, a need for an operation for mounting the probe needle 20 or for connecting the needle to the wiring pattern can be obviated, and the probe card 1 can be manufactured easily and efficiently.

It is to be noted that the above-described probe card of the present invention is not restricted to only the above-described embodiments, and can, needless to say, be variously modified in the scope of the present invention. For example, in the above-described embodiments, an example in which silicon (Si), or nickel (Ni) is used as the material of the probe needle has been described, but other materials may also be used as long as the fine probe needle can be formed. Especially a material having high elasticity is preferable in such a manner that the needle contacting the wafer functions as a spring. For example, in addition to silicon and nickel described above, beryllium copper (Be—Cu), tungsten and the like are usable.

Moreover, in the above-described embodiments, an example in which the flat portion is formed into the same shape as that of the wiring pattern on the wiring pattern of the substrate (built-up board) has been described, but a formed place or shape of the flat portion is not especially restricted. Therefore, the flat portion may also be formed into an optional shape in a place other than that on the wiring pattern of the substrate, for example, in accordance with a size, shape and the like of the probe needle to be mounted.

INDUSTRIAL APPLICABILITY

As described above, according to a probe card and a method of manufacturing the probe card of the present invention, a probe needle which contacts an electrode of a wafer is formed finely using nickel, silicon or the like, and a highly precisely flattened flat portion can be formed on a substrate on which the probe needle is to be mounted or fixed.

Accordingly, a probe card can be realized in which micro probe needles are arranged at high density and with high precision while fluctuations of needle height are eliminated without requiring a complicated structure or the like.

The invention claimed is:

1. A probe card disposed in a wafer tester, comprising:
a substrate having a wiring pattern which transmits a test signal to be applied to a wafer constituting a testing object where a surface of the substrate has unevenness in height;
a plurality of probe needles each being formed separately from the substrate and disposed on the substrate and connected to the wiring pattern through a bottom end thereof while a top end thereof is free to directly contact electrodes of the wafer to be tested, where each of the probe needles has a height identical to one another; and
a plurality of flat portions each being formed on the surface of the substrate and whose surface is flattened so that the surfaces of the plurality of flat portions have the same vertical level with one another by compensating the unevenness of the substrate, the bottom end of the probe needle being mounted on the surface of the corresponding flat portion through an adhesive.

2. The probe card according to claim 1, wherein the flat portion is flattened by polishing its surface thereby compensating the unevenness of the substrate.

3. The probe card according to claim 1, wherein the substrate includes a built-up portion formed on the surface, and the flat portion is formed on the surface of the built-up portion of the substrate.

4. The probe card according to claim 1, wherein the flat portion is formed on and along the wiring pattern.

5. The probe card according to claim 1, wherein the flat portion is constituted of a plating layer formed on the substrate.

6. The probe card according to claim 1, wherein the flat portion is constituted of a mask layer formed on the substrate.

7. The probe card according to claim 1, wherein the flat portion is constituted of a built-up layer formed on the substrate.

8. The probe card according to claim 1, wherein the probe needle includes a base portion and a plurality of needle portions protruding in a comb shape from the base portion.

9. The probe card according to claim 1, wherein the probe needle is constituted of silicon formed into a needle shape, and a conductive pattern formed on the surface of silicon.

* * * * *